(12) United States Patent
Kuglin (10) Patent No.: US 6,246,737 B1
(45) Date of Patent: Jun. 12, 2001

(54) APPARATUS FOR MEASURING INTERVALS BETWEEN SIGNAL EDGES

(75) Inventor: Philip Theodore Kuglin, Tualatin, OR (US)

(73) Assignee: Credence Systems Corporation, Fremont, CA (US)

(*) Notice: Subject to any disclaimer, the term of this patent is extended or adjusted under 35 U.S.C. 154(b) by 0 days.

(21) Appl. No.: 09/427,464

(22) Filed: Oct. 26, 1999

(51) Int. Cl.[7] ............................. H03B 27/00; H04L 7/00; G04F 10/04
(52) U.S. Cl. ....................... 375/371; 375/373; 375/376; 331/45; 331/57; 368/113; 368/118; 455/260; 968/844
(58) Field of Search .................... 368/113, 118; 375/224, 371, 327; 331/45, 57; 968/844, 846, 847

(56) References Cited

U.S. PATENT DOCUMENTS

| | | | |
|---|---|---|---|
| 3,983,481 | * 9/1976 | Nutt et al. | 368/118 |
| 5,270,666 | * 12/1993 | Rapeli et al. | 329/341 |
| 5,289,135 | 2/1994 | Hoshino et al. | 327/3 |
| 5,684,760 | * 11/1997 | Hunter | 368/120 |
| 5,689,539 | * 11/1997 | Murakami | 377/20 |
| 5,805,532 | * 9/1998 | Murakami | 368/113 |
| 5,847,590 | 12/1998 | Yamazaki | 327/265 |
| 5,903,522 | * 5/1999 | Carley | 368/118 |
| 6,121,810 | * 9/2000 | Philpott | 327/270 |

* cited by examiner

Primary Examiner—Stephen Chin
Assistant Examiner—Paul N Rupert
(74) Attorney, Agent, or Firm—Daniel J. Bedell; Smith-Hill and Bedell (57) ABSTRACT

An apparatus for measuring a time interval between a start signal edge and a stop signal edge provides a stable clock signal as input to a delay line formed by a series of similar logic gates. The output signal of the last gate of the series is phase locked to the clock signal by adjusting a bias signal controlling the switching speed of all gates. The clock signal and the output signal of each gate form a set of phase distributed periodic timing signals applied to a start time measurement unit (TMU) and a similar stop TMU. The start TMU counts edges of one of the timing signals occurring between an edge of an arming signal and the start signal edge and generates output data representing a time delay between the arming signal and the start signal edge. The data represents the start delay as a whole and fractional number of clock signal periods by conveying the counter output and by indicating which of the timing signals had an edge most closely following the start signal edge. The stop TMU similarly produces output data indicating a whole an fractional number of clock cycles occurring between the arming signal and the stop signal edge. The delay represented by the start TMU output data is subtracted from the delay represented by the stop TMU output data to determine the interval between the start and stop signal edges.

14 Claims, 4 Drawing Sheets

APPARATUS FOR MEASURING INTERVALS BETWEEN SIGNAL EDGES

BACKGROUND OF THE INVENTION

1. Field of the Invention

The present invention relates in general to an apparatus for measuring a time interval between two signal edges and in particular to an apparatus employing clock signals of a delay-locked loop delay line as timing references.

2. Description of Related Art

One known system for measuring a time interval between two signal edges employs a crystal oscillator producing a clock signal having a stable, predictable frequency and a counter for counting pulses of the clock signal and producing output data representing its count. A "start" signal edge connects the clock signal to the counter so that it may begin counting clock signal pulses. A "stop" signal edge thereafter disconnects the clock signal from the counter so that it stops counting clock signal pulses. The value represented by the ending count, multiplied by the period of the clock signal, equals the interval between the start and stop signal edges. Unless the start and stop signal pulses happen to be synchronized to clock signal pulses, the error in the interval measurement can be as large as the period of the clock signal output of the crystal oscillator. Thus some other means for measuring a time interval is needed if we want to reduce the measurement error to a value that is smaller than the period of the crystal oscillator.

U.S. Pat. No. 5,847,590 issued Dec. 8, 1998 to Yanazaki and U.S. Pat. No. 5,289,135 issued Feb. 22, 1994 to Hoshino et al describe interval measurement devices that employ a ring oscillator to produce N clock signals having the same period P but which are evenly distributed in phase so as to divide the clock signal period in to N equal segments. A ring oscillator consists of a set of inverting logic gates connected in a loop with each gate passing a pulse arriving from a preceding gate to a next gate within the loop. When the loop is closed, a signal edge circulates through the loop, changing the signal state at each successive gate's output. The N clock signals are derived at the outputs of the gates forming the loop. Each clock signal oscillates with the frequency at which the signal edge circulates through the loop and with a phase that depends on the position in the loop of the gate generating the clock signal. The phase shift from one clock signal to the next is equal to the switching speed of that gate producing it. When the gates all have the same switching speed, the clock signals phases are evenly distributed.

In the systems described above, the START signal pulse closes the loop thereby causing a pulse to begin circulating through the gates and triggering production of the N output clock signals. Thereafter a counter counts cycles of one of the N clock signals until a STOP signal edge halts the count. At that point the counter output data indicates a whole number of clock signal cycles that elapsed between the START and STOP signal edges. The states of oscillator's N output clock signals form an N-bit data word representing a fractional portion of a clock cycle that may be added to the whole number of clock cycles represented by the counter output to determine the interval between the START and STOP signal edges.

Assuming the clock signal period is stable and predictable, these systems can measure a time interval between two signal edges to within about 1/Nth of the period of the ring oscillator's clock signals. However the clock signal period of a free-running ring oscillator depends on the switching speed of each gate forming the oscillation, and that switching speed is neither stable nor predictable. Since a logic gate's switching speed depends in part on the nature of the semiconductor material forming it, natural process variations occurring in that semiconductor material make it difficult to accurately predict the speed of the gate. A logic gate's switching speed is also influenced by its operating environment including its temperature and power supply level which can vary unpredictably. Thus the accuracy with which the systems described above can measure a time interval between the START and STOP signal edges is adversely affected by unpredictability in the period of the ring oscillator's output signal due to unpredictable process and environmental variations influencing the switching speed of the gates forming the oscillator.

What is needed is an apparatus for measuring a time interval between two signal edges using a stable, predictable clock signal as a timing reference, and which can measure that time interval with an error that is much smaller than the period of the clock signal.

SUMMARY OF THE INVENTION

In accordance with one aspect of the invention, an apparatus for measuring a time interval between a START signal edge and a STOP signal edge employs a crystal oscillator producing a stable, predictable clock signal that is not affected by temperature or process variations. The clock signal provides an input to a delay line formed by a series of N similar logic gates, with each successive gate delaying the clock signal with a delay determined by a control signal voltage (CONTROL) supplied in common to all gates. The CONTROL signal voltage which may be either a power supply or bias voltage influences the switching speed of the gates. The clock signal and the output signal of each gate form a set of timing signals T0-TN used as timing references for measuring interval between the START and STOP signal edges.

In accordance with another aspect of the invention an additional gate similar to the other gates of the delay line delays the output signal TN of the last gate of the delay line to provide a reference signal. A phase lock controller compares the phase of the reference signal to the phase of the clock signal input to the delay line and adjusts the CONTROL signal controlling the switching speed of all gates so as to phase lock the reference signal to the clock signal. This renders the switching speed of the gates uniform, stable and predictable despite temperature and processes variations and therefore renders the period and phase of each timing signal T0-TN stable and predictable.

In accordance with another aspect of the invention, the apparatus includes a "start" time measurement unit (TMU) and a similar "stop" TMU. The start TMU counts the number of edges of one of the timing signals T0-TN occurring between an edge of a reference signal (ARMING) and the START signal edge and generates output data reflecting that count. The start TMU also monitors the states of all timing signals T0-TN produced by the timing signal generator and its output data also indicates which of the N+1 timing signals had an edge most closely following the START signal edge. The output data (START_DELAY) of the start TMU therefore represents a measured time delay between the ARMING signal and the START signal edge as a whole and fractional number of clock signal periods. Similarly the stop TMU produces output data indicating the number of edges of the same timing signal that occurred between the ARMING signal edge and the STOP signal edge and indicating which of timing signals T0-TN had an edge most nearly following the STOP signal edge. Thus the output data (STOP_DELAY) of the stop TMU represents a measured time delay between the ARMING signal and the STOP signal edge as a whole and fractional number of clock signal periods.

In accordance with a further aspect of the invention, the apparatus includes a decoder decoding the combination of START_DELAY and STOP_DELAY data to produce output data (INTERVAL) representing the interval between the START and STOP signal edges. The INTERVAL data represents a time difference between the START signal edge time delay represented by the START_DELAY data and the STOP signal edge time delay represented by the STOP_DELAY data.

The measurements of the START and STOP delays have an inherent inaccuracy that can be as large as one cycle of the clock signal because timing of the ARMING signal relative to the edge of the timing signal that triggers the counter of each TMU is unpredictable and can vary as much as one full clock cycle. However since the resulting errors in the start delay measurement and the stop delay measurement performed by the two TMUs are identical, the errors cancel when the decoder subtracts the start delay from the stop delay to determined the interval between the START and STOP signal edges. Thus the interval measured by the apparatus is accurate to within 1/Nth of the period of the clock signal and the measurement is not substantially affected by process or environmental variation.

It is accordingly an object of the invention to provide an apparatus for measuring a time interval between two signal edges using a stable, predictable clock signal as a timing reference, that is capable of measuring that time interval with an error that is much smaller than the period of the clock signal.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

DESCRIPTION OF THE PREFERRED EMBODIMENT(S)

Figure 1:
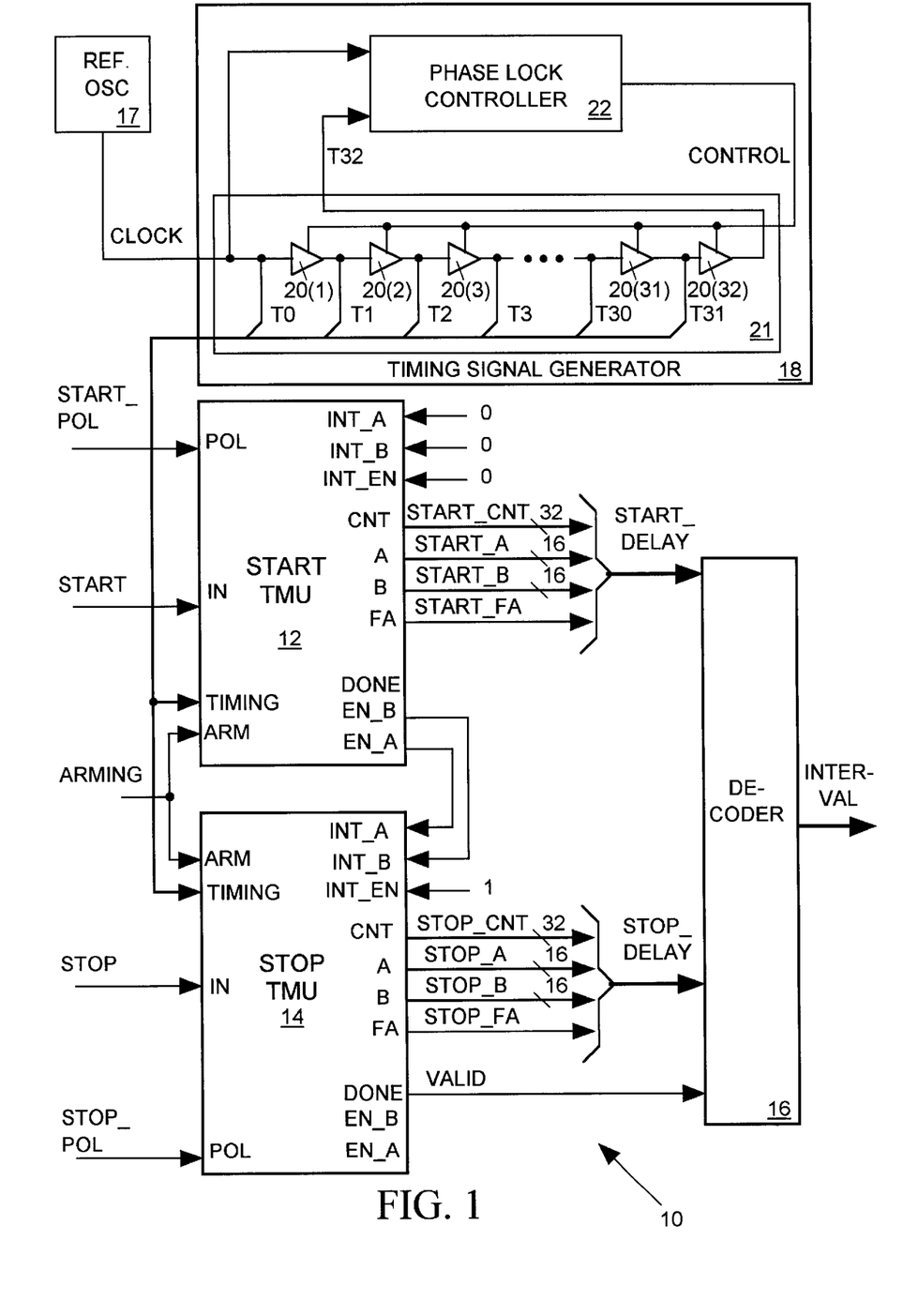
FIG. 1 illustrates in block diagram form a time interval measurement apparatus in accordance with the invention for generating output data indicating a time interval between two input signal pulse edges.

FIG. 1 illustrates a time interval measurement apparatus 10 in accordance with the invention for generating output data (INTERVAL) indicating a time interval between two signal pulse edges (START and STOP). Apparatus 10 includes a start TMU 12 for measuring a delay between a leading edge of a reference signal (ARMING) and the START signal edge and for producing output data (START_DELAY) representing that delay. Similarly a stop TMU 14 measures the delay between the ARMING signal edge and the STOP signal edge and generates output data (STOP_DELAY) representing that delay. As discussed below, start and stop TMUs 12 and 14 both undervalue the delays they measure, but they do so by the same amount. Thus when we subtract the START signal delay reported by the START_DELAY data from the STOP signal delay reported by the STOP_DELAY data, we find that the errors cancel one another and that the result accurately reflects the interval between the START and STOP signal edges. Apparatus 10 includes a decoder 16 for performing the "subtraction" by decoding the combination of START_DELAY and STOP_DELAY data to produce the output INTERVAL data representing that time interval.

Timing Signal Generator

The START_DELAY and STOP_DELAY data represent delays as the sum of a whole and fractional number (e.g., 0, $\frac{1}{32}$, $\frac{2}{32}$ . . . $\frac{31}{32}$) of cycles of a periodic clock signal (clock) produced by a reference oscillator 17. A delay-locked loop timing signal generator 18 generates and supplies a set of 32 input timing signals T0–T31 to start and stop TMUs 12 and 14 for use as timing references when measuring intervals between pulse edges. Each timing signal T0–T31 has the same frequency as the clock signal but they are evenly distributed in phase so that their edges are $\frac{1}{32}$ of one cycle of the clock signal apart, thereby evenly dividing the period of the clock signal into 32 separate time slots.

The conventional timing signal generator 18 includes a set of thirty-two identical gates 20(1)–20(32) connected in series to form a delay line 21. The clock signal, which also acts as the T0 signal, drives the first gate 20(1) of delay line 21. Gate 20(1) delays the clock signal (T0) by $\frac{1}{32}$ of the period of the clock signal to produce timing signal T1. The second gate 20(2) delays timing signal T1 by $\frac{1}{32}$ of the period of the clock signal to produce T2. Similarly all gates 20(3)–20(32) delay a timing signal output of their preceding gate by $\frac{1}{32}$ of a clock signal cycle to produce timing signals T3–T32.

A conventional phase lock controller 22 supplies a control signal (CONTROL) input to each gate 20. The voltage of the CONTROL signal, which may be either the power supply or bias voltage input to each gate 20, controls the gate's delay by controlling its switching speed. A lock controller 22 compares the phase of the clock signal as it arrives at the input of the first gate 20(1) of the series to the phase of the output signal T32 of the last gate 20(32) of the series. When the T32 signal leads the clock signal, phase lock controller 22 changes the CONTROL voltage supplied to gates 20 to reduce their switching speed, thereby increasing the delay between clock and T32. When the T32 signal lags the clock signal, phase lock controller 22 adjusts the CONTROL signal voltage on gates 20 to increase their switching speed, thereby decreasing the delay between clock and T32. The feedback loop thus holds the T32 signal in phase with the clock signal, with all timing signals T0–T32 having the same frequency as the clock signal, and with edges of timing signals T0–T31 are progressively shifted in phase with their edges evenly dividing the period of the clock signal into 32 separate time slots. As described below, START TMU 12 and stop TMU 14 use the T0–T31 signals as timing references when measuring intervals and are therefore able to measure the START and STOP signal edge delays with a resolution of $\frac{1}{32}$nd of the period of the clock signal.

Time Measurement Unit Input/Output Signals

Start and stop TMUs 12 and 14 are identical circuits although there are some differences in their behavior due to the way they are interconnected. Both TMU units 12 and 14 have the input and output terminals listed in Table I:

TABLE I

| TERMINAL | TYPE | FUNCTION |
|---|---|---|
| TIMING | input | T0–T31 input (32 bits) |
| IN | input | START or STOP signal input |
| POL | input | indicates STOP or START signal edge polarity |
| ARM | input | ARMING signal |
| INT_EN | input | interlock enable |
| INT_A | output | A phase interlock |
| INT_B | output | B phase interlock |
| DONE | output | data valid signal |
| CNT | output | clock cycle count (32-bits) |
| A | output | START_A or STOP_A output |
| B | output | START_B or STOP_B output |
| FA | output | START_FA or STOP_FA output |

TIMING

The 32 timing input terminals of each TMU 12 and 14 receive the T0–T31 timing signals.

IN

The IN input of TMU 12 receives the signal conveying the START signal edge while the IN input of TMU 14 receives the signal conveying the STOP signal edge. The START and STOP signal edges may appear in the same signal or in different signals.

POL

The state (high or low) of a START_POL signal applied to the POL input of start TMU 12 indicates whether the START signal edge is to be a leading or trailing edge, respectively. Similarly, the state of a STOP_POL signal applied to the POL input of stop TMU 14 indicates whether the STOP signal edge is to be a leading or trailing edge.

ARM

The arm inputs TMUs 12 and 14 receive the ARMING signal.

INT_EN, INT_A, INT_B, EN_A, EN_B

The INT_EN input of TMU 12 is set low (logical "0") to indicate that TMU 12 is to act as the start TMU, while the INT_EN input of stop TMU 14 is set high (logical "1") to indicate that it TMU 14 to act as the stop TMU. When signal(s) conveying the START and STOP signal edges are periodic, the start TMU 12 simply chooses the first input signal edge following the ARMING signal pulse as the START signal edge. However it is necessary to ensure that start TMU 12 chooses a START signal edge before stop TMU 14 chooses an edge of its input signal as the STOP signal edge. Therefore after detecting the ARMING signal, stop TMU 14 refrains from accepting an edge of its input signal as the STOP signal edge until start TMU 12 signals stop TMU 14 that it has accepted one of its input signals as the START signal edge.

Since TMUs 12 and 14 are identical circuits, each TMU includes an input terminal INT_EN for receiving a signal indicating whether it is to act as a start TMU or a stop TMU. With its INT_EN input set low (logical "0"), start TMU 12 treats the first input signal edge of the appropriate polarity occurring after the ARMING signal edge as the START signal edge. Thereafter, after having detected an ARMING signal pulse and accepted one of its input signal edges as the START signal edge, start TMU 12 drives one of a pair of output enabling signals EN_A and EN_B high. These signals drive interlock inputs INT_A and INT_B of stop TMU 14.

With its INT_EN input driven high (logical "1"), stop TMU 14 ignores all input signal edges following the ARM-ING signal edge until start TMU 12 drives one the stop TMU's INT_A or INT_B inputs high. Start TMU 14 then accepts the next arriving input signal edge of the appropriate polarity as the STOP signal edge.

DONE

Each TMU 12 and TMU 14 drives its DONE output high to indicate when its measurement is complete and its output data START_DELAY or STOP_DELAY is valid. In FIG. 1, the DONE output of stop TMU 14 is applied as VALID signal input to decoder 16 to tell it when to decode the START_DELAY and STOP_DELAY data to produce the INTERVAL data output of apparatus 10.

CNT, A, B, FA

The CNT, A, B, FA output terminals of TMUs 12 and 14 convey four separate fields of the TMU output data, START_DELAY or STOP_DELAY. TMUs 12 and 14 represent intervals between the ARMING signal edge and the START or STOP signal edge as a whole and fractional number (in $\frac{1}{32}$nds) of clock signal cycles. A 32-bit CNT field indicates the whole number portion of the interval. A pair of 16-bit fields A and B and a single-bit field FA form a code representing the fractional portion of the interval. Table II below lists fractional values represented by the 32-bit code formed by the A, B and FA fields.

TABLE II

| A | B | FA | VALUE |
|---|---|---|---|
| 1111111111111111 | 1111111111111111 | 1 | 0/32 |
| 0111111111111111 | 1111111111111111 | 1 | 1/32 |
| 0011111111111111 | 1111111111111111 | 1 | 2/32 |
| 0001111111111111 | 1111111111111111 | 1 | 3/32 |
| 0000111111111111 | 1111111111111111 | 1 | 4/32 |
| 0000011111111111 | 1111111111111111 | 1 | 5/32 |
| 0000001111111111 | 1111111111111111 | 1 | 6/32 |
| 0000000111111111 | 1111111111111111 | 1 | 7/32 |
| 0000000011111111 | 1111111111111111 | 1 | 8/32 |
| 0000000001111111 | 1111111111111111 | 1 | 9/32 |
| 0000000000111111 | 1111111111111111 | 1 | 10/32 |
| 0000000000011111 | 1111111111111111 | 1 | 11/32 |
| 0000000000001111 | 1111111111111111 | 1 | 12/32 |
| 0000000000000111 | 1111111111111111 | 1 | 13/32 |
| 0000000000000011 | 1111111111111111 | 1 | 14/32 |
| 0000000000000001 | 1111111111111111 | 1 | 15/32 |
| 1111111111111111 | 1111111111111111 | 0 | 16/32 |
| 1111111111111111 | 0111111111111111 | 0 | 17/32 |
| 1111111111111111 | 0011111111111111 | 0 | 18/32 |
| 1111111111111111 | 0001111111111111 | 0 | 19/32 |
| 1111111111111111 | 0000111111111111 | 0 | 20/32 |
| 1111111111111111 | 0000011111111111 | 0 | 21/32 |
| 1111111111111111 | 0000001111111111 | 0 | 22/32 |
| 1111111111111111 | 0000000111111111 | 0 | 23/32 |
| 1111111111111111 | 0000000011111111 | 0 | 24/32 |
| 1111111111111111 | 0000000001111111 | 0 | 25/32 |
| 1111111111111111 | 0000000000111111 | 0 | 26/32 |
| 1111111111111111 | 0000000000011111 | 0 | 27/32 |
| 1111111111111111 | 0000000000001111 | 0 | 28/32 |
| 1111111111111111 | 0000000000000111 | 0 | 29/32 |
| 1111111111111111 | 0000000000000011 | 0 | 30/32 |
| 1111111111111111 | 0000000000000001 | 0 | 31/32 |

For example, when the interval between the ARMING pulse edge and the START signal edgte is 19–$\frac{30}{32}$ times the period of the clock signal, the various fields the output data TMU 12 or 14 produces will be as follows:

| | |
|---|---|
| CNT: | 0000000000010011 (19 decimal) |
| A: | 1111111111111111 |
| B: | 0000000000000011 |
| FA: | 0 |

For convenience the CNT field value is indicated above in decimal form but the CNT actually appears in binary encoded form.

Time Measurement Unit

Figure 2:
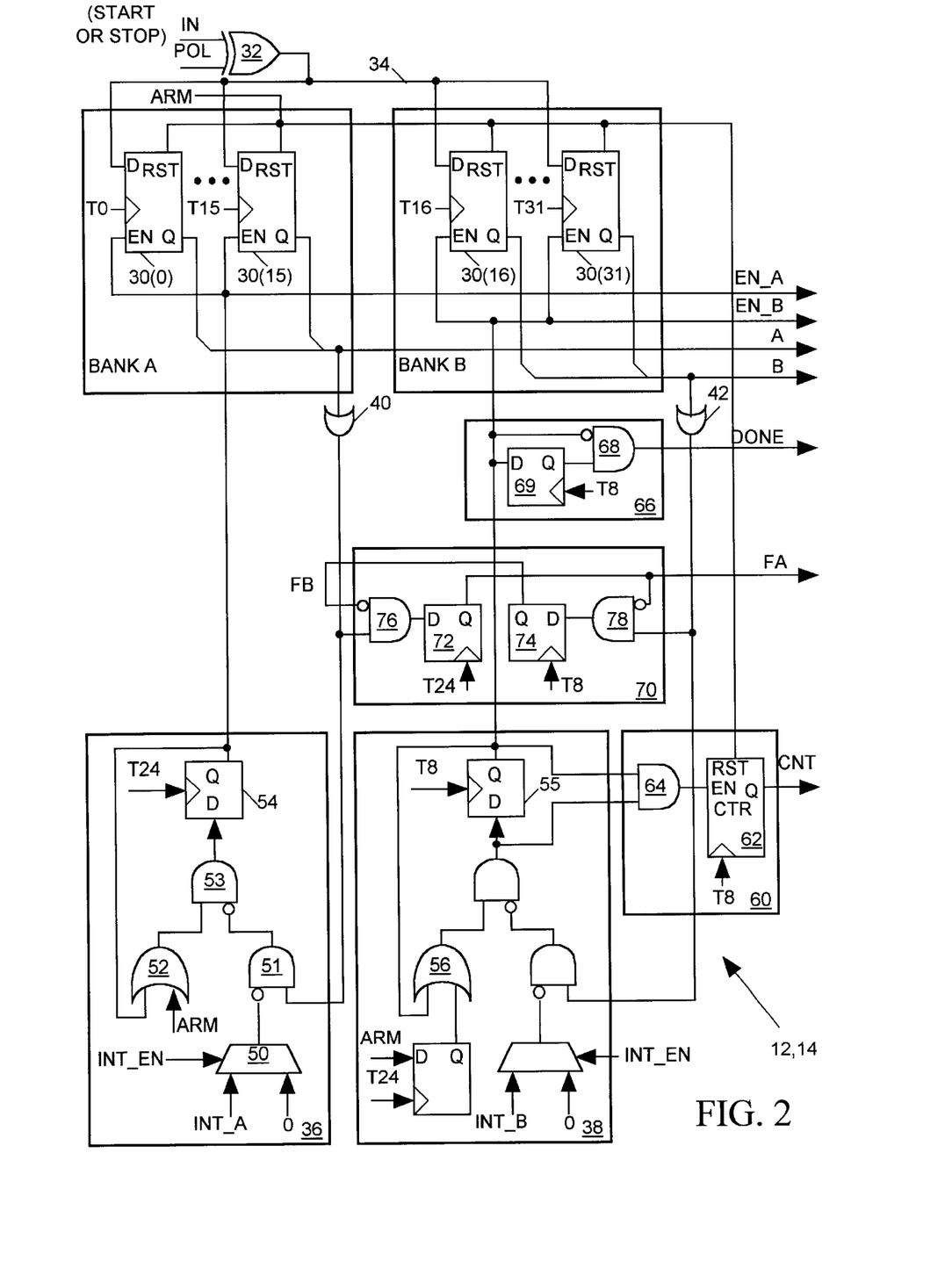
FIG. 2 illustrates either one of the two time management units of FIG. 1 in more detailed schematic and block diagram form.

FIG. 2 illustrates either one of the TMUs 12 and 14 of FIG. 1 in more detailed schematic and block diagram form. Each TMU includes two banks of flip-flops, bank A and bank B. Bank A includes sixteen type D flip-flops 30(0)–30(15) clocked by timing signals T0–T15, respectively, while bank B includes sixteen type D flip-flops 30(16)–30(31) clocked by timing signals T16–T31, respectively. The ARMING signal edge resets all flip-flops 30(0)–30(31) and counter 62. An XOR gate 32 XORs TMU's input signal (START or STOP) with its polarity input signals arriving at the IN and POL terminals to produce a signal 34 driving the D inputs of all flip-flops 30(0)–30(31). The EN_A TMU output signal produced by a phase A enabling circuit 36 drives the enable (EN) inputs of bank A flip-flops 30(0)–30(15) while the EN_B TMU output signal produced by an enabling logic circuit 38 drives the enable inputs of bank B flip-flops 30(16)–30(31).

In addition to resetting flip-flops 30(0)–30(31), the ARMING signal pulse edge tells phase A enabling circuit 36 to assert its EN_A output on the first T24 signal edge following the ARMING signal edge, thereby enabling all bank A flip-flops 30(0)–30(15). On the first T8 signal pulse edge after the bank A flip-flops are enabled, enabling circuit 38 enables the bank B flip-flops 30(16)–30(31).

With all flip-flops 30(0)–30(31) enabled, edges of timing signals T0–T31 successively clock each flip-flop 30(0)–30(31) during each cycle of the clock signal. As long as the state of the START or STOP signal arriving at the IN terminal continues to match the state of the polarity indicating signal arriving at the POL terminal of TMU 12, XOR gate 32 holds the D inputs of all flip-flops 30(0)–30(31) low. Thus the Q output of flip-flops 30(0)–30(31) remain low. When a START or STOP signal edge arrives at the IN terminal of TMU 12, the START or STOP signal changes state and no longer matches the POL signal state. XOR gate 32 therefore drives the D inputs of all flip-flops 30(0)–30(31) high.

Suppose, for example, that the TMU of FIG. 2 is acting as a start TMU and that the START signal edge arrives just before timing signal T15 clocks flip-flop 30(15). Then following the START signal edge, the Q outputs of flip-flops 30(15)–30(31) will go high in succession as timing signals T15-T31 progressively clock those flip-flops. Immediately following the edge of timing signal T31, the A output of TMU 12 will have value 0000000000000001 and the B output of TMU 12 will have value 1111111111111111. Note that these values correspond to the $^{15}\!/_{32}$ value for A and B shown in Table I above.

Phase A enabling circuit 36 monitors the output of an OR gate 40 which ORs the Q outputs of all bank A flip-flops 30(0)–30(15). When the TMU is acting as start TMU 12, the INT_EN input supplied to enabling circuits 36 and 38 is held low. Thus when the output of OR gate 40 goes high, indicating that one of bank A flip-flops 30(0)–30(15) has detected the START signal edge has occurred, enabling circuit 36 de-asserts its output EN_A signal on the next arriving pulse of the T24 signal. This prevents the next arriving set of T0–T15 timing signal edges from clocking flip-flops 30(0)–30(15). Therefore the Q outputs of flip-flops 30(0)–30(14) remain low and the Q output of flip-flop 30(15) remains high despite any subsequent changes in state of the START signal. Thus the A output of TMU 12 remains fixed at 0000000000000001 until after the TMU is re-armed.

Similarly phase B enabling circuit 38 monitors the output of an OR gate 42 ORing the Q outputs of bank B flip-flops 30(16)–30(31) and (with INT_EN held low) de-asserts the EN_B signal on the first pulse of the T8 signal to occur after the output of OR gate 42 goes high. This prevents the next set of T16–T31 timing signal edges from clocking flip-flops 30(16)–30(31). Therefore in the example case, where the START signal pulse occurs immediately before the T15 signal edge, the Q outputs of flip-flops 30(16)–30(31), the B output of TMU 12 remains at 1111111111111111 until the ARMING signal subsequently resets those flip-flops.

TMU 12 includes a circuit 70 for monitoring the outputs of OR gates 40 and 42 and for driving the FA output signal of TMU 12 low on the first T24 pulse after the ARMING signal edge resets the bank A flip-flops. Thereafter circuit 70 drives the FA signal high when OR gate 40 indicates a Q output of any bank A flip-flop 30(0)–30(15) is set in response to an incoming START signal before OR gate 42 indicates a bank B flip-flop 30(16)–30(31) Q output has been driven high. As illustrated in Table I, the FA output signal is used as a field of the START_DELAY output data of TMU 12 to resolve an ambiguity between A and B values for $^{9}\!/_{32}$ and $^{16}\!/_{32}$. That is, when A and B both have value 1111111111111111, then the fractional value of the delay represented by the START_DELAY could be either $^{9}\!/_{32}$ or $^{16}\!/_{32}$. The FA bit resolves the ambiguity.

When the TMU of FIG. 2 is acting as stop TMU 14 of FIG. 1, the INT_EN input to enabling circuits 36 and 38 is held high and the EN_A and EN_B outputs of start TMU 12 drive the INT_A and INT_B inputs of the stop TMU's enabling circuits 36 and 38. When OR gate 40 or 42 signals enabling circuit 36 or 38 that one of the bank A or bank B flip-flops has detected that the STOP signal edge has occurred, enabling circuits 36 and 38 refrains from driving the EN_A and EN_B signals low if the start TMU has not yet driven the INT_A and INT_B signals low. However when the start TMU has driven the INT_A signal low before OR gate 40 signals enabling circuit 36 that the STOP signal edge has occurred, then enabling circuit 36 disables the bank A flip-flops on the next T24 pulse. Likewise, when the start TMU has already driven the INT_B signal low when OR gate 42 tells enabling circuit 38 that the STOP signal edge has occurred, enabling circuit 38 disables the bank B flip-flops on the next T8 pulse.

Enabling circuit 36 includes a multiplexer 50 controlled by the INT_EN input signal, receiving the INT_A signal and a hard-wired "0" as inputs, and driving an inverting input of an AND gate 51. The output of OR gate 40 drives a non-inverting input of AND gate 51. An OR gate 52 ORs the ARM input with the EN_A signal output to produce a signal driven an input of an AND gate 53. The output of AND gate 51 drives an inverting input of AND gate 53. AND gate 53 controls a D input of a flip-flop 54 clocked by timing signal T24. Flip-flop 54 produces the EN_A signal at its Q output. Enabling circuit 38 is generally similar to enabling circuit 36 except that its output flip-flop 55 is clocked by timing signal T8. Also in enabling circuit 38, the ARM terminal is not directly connected to an input of an or gate 56 corresponding to OR gate 52 of enabling circuit 36. Instead a flip-flop 56 clocked by timing signal T24 clocks the ARMING signal arriving at the ARM input onto the input of OR gate 56. This ensures that the bank A flip-flops not enabled before the bank B flip-flops.

The TMU 12 or 14 illustrated in FIG. 2 also includes a circuit 60 including a 32-bit counter 62 for counting the number of T8 timing signal pulses occurring while enabling circuit 38 is enabling bank B to generate the TMU's CNT output data. Counter 62, reset by the ARMING signal, is enabled by the output of an AND gate 64 that ANDs the D input and Q output of flip-flop 55.

Each TMU further includes a circuit 66 for monitoring the EN_B signal output of enabling circuit 38 and driving the DONE signal high on the first T8 signal pulse after the EN_B signal is driven low, thereby indicating that TMU 12 has completed its time measurement and that it is now producing valid output data. Circuit 66 then drives the DONE signal low again on the next T8 pulse. Circuit 66 includes a type-D flip-flop 69 clocked by timing signal T8, receiving the EN_B signal at its D input and supplying its Q output to an input of an AND gate 68. AND gate 68 receives the EN_B signal at an inverting input and generates the DONE signal at its output.

Each TMU also includes a circuit 70 for monitoring the outputs of OR gates 40 and 42 and for driving the TMU's FA output signal low on the first T24 pulse after the ARMING signal edge resets the bank A flip-flops. Thereafter circuit 70 drives the FA signal high when OR gate 40 indicates a Q output of any bank A flip-flop 30(0)–30(15) is set in response to an incoming START signal before OR gate 42 indicates a bank B flip-flop 30(16)–30(31) Q output has been driven high. As illustrated in Table I, the FA output signal is used as a field of the START_DELAY output data of TMU 12 to resolve an ambiguity between A and B values for 0/32 and 16/32. That is, when A and B both have value 1111111111111111, then the fractional value of the delay represented by the START_DELAY could be either 0/32 or 16/32. The FA bit resolves the ambiguity.

Circuit 70 includes a type D flip-flop 72 clocked by the T24 timing signal for producing the FA signal at its Q output and a flip-flop 74 clocked by the T8 timing signal for producing an FB signal at its Q output. An AND gate 76 receives the FB signal at an inverting input and ANDs it with the output of OR gate 40 to produce a signal for driving the D input of flip-flop 72. Similarly an AND gate 78 receives the FA signal at an inverting input and ANDs it with the output of OR gate 42 to produce a signal controlling the D input of flip-flop 74.

Signal Timing

Figure 3:
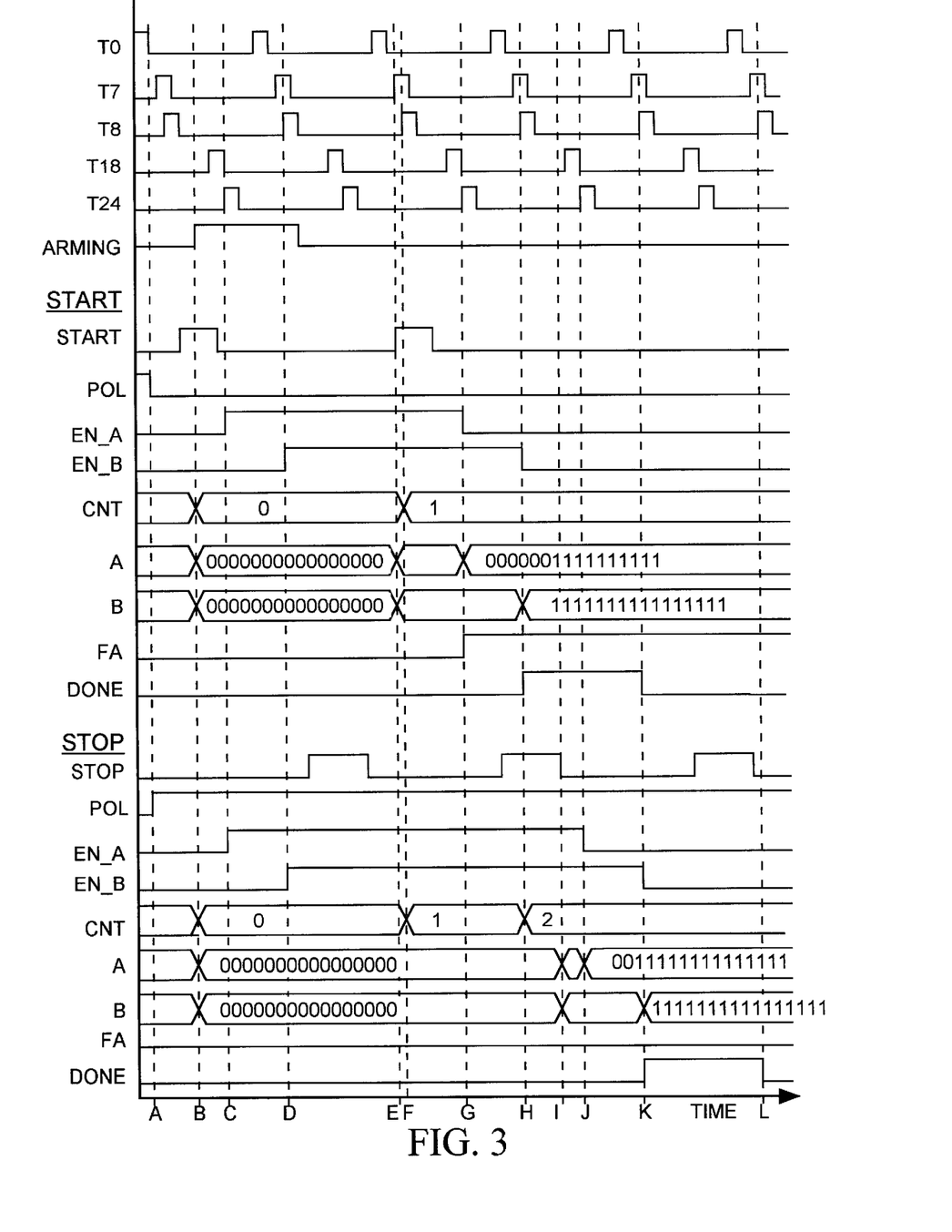
FIG. 3 is a timing diagram illustrating behavior of various signals of the time interval measurement apparatus of FIG. 1.

FIG. 3 is a timing diagram illustrating behavior of various input and output signals of TMU 12 and TMU 14 of FIG. 1 when set to measure the difference between the leading edge of a START signal pulse and the trailing edge of a STOP signal pulse occurring in two different signals. In this particular example, the START signal conveys a single pulse while the STOP signal is periodic. The following describes changes in signals shown in FIG. 3 at various times.

Time A:

At some time A prior to arrival of the ARMING signal pulse, the START_POL signal input to start TMU 12 is set low to indicate the START signal edge is to be a leading edge while the state of a STOP_POL signal input to TMU 14 is set high to indicate the STOP signal edge is to be a trailing edge.

Time B:

The ARMING signal is driven high, resetting the bank A and bank B flip-flops 30 and counter 62 of both TMUs 12 and 14 and thereby driving both the A and B output data fields of both TMUs to 0000000000000000 and driving the CNT field to 0.

Time C:

In response to the next pulse of the T24 signal following the leading edge of the ARMING signal pulse, start and stop TMUs 12 and 14 both drive their EN_A signals high to enable their bank A flip-flops.

Time D:

In response to the next pulse of the T8 signal, start and stop TMUs 12 and 14 both drive their EN_B signals high to enable their bank B flip-flops.

Time E:

The leading edge of the START signal arrives slightly before the leading edge of a pulse of timing signal T7. Thereafter timing signal edges begin to set some of the bank A and bank B flip-flops within TMU 12.

Time F:

The next edge of the T8 pulse increments the CNT fields of the start and stop TMUs 12 and 14 to 1.

Time G:

On the leading edge of the next T24 pulse, start TMU 12 disables its bank A flip-flops by driving its EN_A signal low. Start TMU 12 also drives its output FA signal high.

Time H:

On the leading edge of the next T8 pulse, start TMU 12 disables its bank B flip-flops by driving its EN_B signal low and drives its DONE signal high. Both TMUs 12 and 14 increment their output CNT fields to 2.

Time I:

Slightly before an edge of T18, a trailing edge of the STOP signal occurs.

Time J:

On the leading edge of the next T24 pulse, stop TMU 14 drives its EN_A signal low to disable its bank A flip-flops.

Time K:

On the leading edge of the next T8 pulse, stop TMU 14 drives its EN_B signal low to disable its bank B flip-flops and drives its DONE signal high. Start TMU 12 also drives its DONE signal output low again.

Time L:

On the leading edge of the next T8 signal pulse, stop TMU 14 drives its DONE signal low again.

After time L, decoder 16 of FIG. 1 decodes the output data of start and stop TMUs 12 and 14 to produce a value of INTERVAL representing the time delay between the leading edge of the START signal pulse appearing at time C and the trailing edge of the STOP signal appearing at time J. The START_DELAY data output (CNT, A, B, and FA) of start TMU 12 indicates a delay time of one and 7/32 of the period of the clock signal. The STOP_DELAY data (CNT, A, B, and FA) of stop TMU 14 indicates a stop delay time of two and 18/32 of the period of the clock signal. Thus the delay between the leading edge of the START signal pulse and the trailing edge of the STOP signal pulse, the difference between the times represented by the outputs of TMUs 12 and 14, is 1 and 11/32 of the period of the clock signal.

Note that the START_DELAY data undervalues the actual delay between the ARMING and START signal edge events and that the STOP_DELAY data undervalues the actual delay between the ARMING and STOP signal pulse events. They both undervalue the time delays by the phase difference between the ARMING signal edge and the edge of the next T0 signal pulse. However since the data outputs of start and stop TMUs 12 and 14 undervalue the delays by similar amounts, the errors cancel on another when decoder 16 produces the out INTERVAL data value. The START_DELAY and STOP_DELAY values could better estimate actual START and STOP signal pulse delays if we gate the ARMING signal with the T0 signal so that the ARMING signal is nearly concurrent with a T0 signal edge. However this would have no effect on the value of the output INTERVAL data.

While apparatus 10 has been illustrated as employing a delay line producing 32 distributed phase timing signals T0–T31, those skilled in the art will appreciate that the apparatus can be adapted to accommodate a delay line 21 producing a larger or smaller number of timing signals by suitably adapting start and stop TMUs 12 and 14 to operate with a larger or smaller set timing signals 32 and by adapting decoder 16 to accommodate differently sized START_DELAY and STOP_DELAY data inputs.

Figure 4:
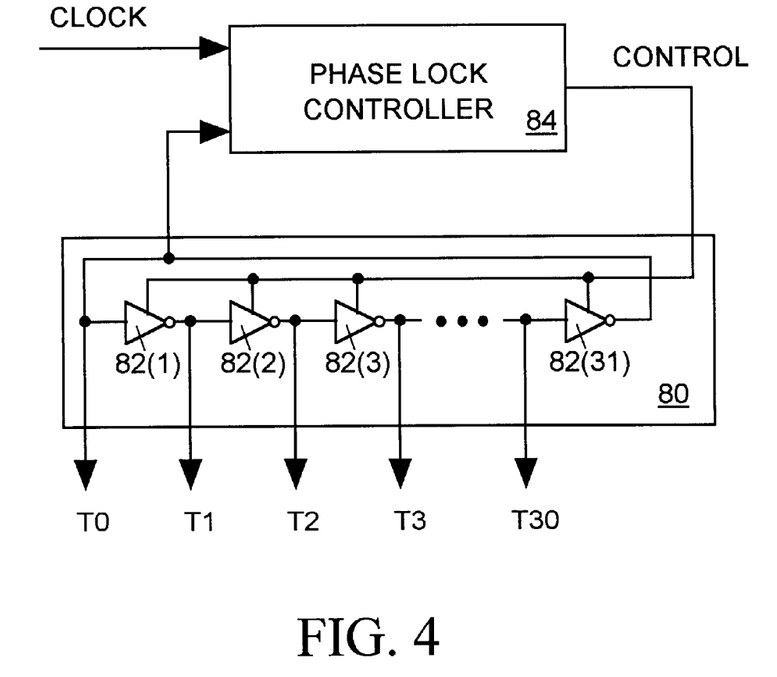
FIG. 4 illustrates in block diagram form an alternative embodiment of the signal generator that may be employed by the time interval measurement apparatus of FIG. 1.

FIG. 4 illustrates a timing signal generator employing a ring oscillator 80 for producing a set of 31 phase distributed timing signals T0–T31. Ring oscillator includes a set of 31 inverter gates 82(1)–82(31) connected to from a loop with each inverter producing a separate one of timing signals T0–T30. A phase lock controller 84 adjusts a CONTROL signal input to each inverter 80(1)–80(31) to phase lock the T0 signal to the clock signal. Ring oscillator 80 requires an odd number of inverters to operate and therefore can only produce an odd number (e.g. 31) of distributed phase timing signals. The delay line-based timing signal generator 18 of FIG. 1 may be implemented instead by the timing signal generator illustrated in FIG. 4. However to do so the start and stop TMUs 12 and 14 must be suitably modified to operate with a set of 31 timing signals rather than the 32 provided by timing signal generator 18 of FIG. 1. Decoder 16 must also be suitably configured to accommodate the one bit reduction in size of the START_DELAY and STOP_DELAY data outputs of the TMUs.

Thus has been shown and described an apparatus for measuring a time interval between two signal edges using a stable, predictable clock signal as a timing reference, wherein the apparatus is capable of measuring that time interval with an error much smaller than the period of the clock signal. While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An apparatus for measuring a time interval between an edge of a start signal and an edge of a stop signal in response to an edge of an input arming signal, the apparatus comprising:

means (17) for generating a clock signal that is periodic;

timing signal generator means (18) for receiving said clock signal for generating a plurality of timing signals (T0–T31) that are frequency locked to said clock signal, each timing signal having a unique phase relative to said clock signal, and each timing signal having periodic edges; and a start time measurement unit (TMU) (12) for receiving said arming signal, said start signal, and said timing signals, for counting a first number of edges of one of said timing signals occurring between said edge of said arming signal edge and said edge of said start signal, for determining which of said timing signals had said edge most closely following said start signal edge, and for producing first output data indicating said first number and indicating which timing signal had said edge most closely following said start signal edge.

2. The apparatus in accordance with claim 1 further comprising:

a stop TMU (14) for receiving said arming signal, said stop signal, and said timing signals, for counting a second number of edges of said one of said timing signals occurring between said edge of said arming signal edge and said edge of said stop signal, for determining which of said timing signals had said edge most closely following said stop signal edge, and for producing second output data indicating said second number and indicating which timing signal had said edge most closely following said stop signal edge.

3. The apparatus in accordance with claim 2 further comprising means (16) for receiving said first and second output data and for generating in accordance therewith interval data representing said time interval between said edge of said start signal and said edge of said stop signal.

4. The apparatus in accordance with claim 3 wherein first output data represents a first interval between said arming signal edge and said start signal edge, wherein said second output data represents a second interval between said arming signal edge and said stop signal edge, and wherein said interval data represents a time difference between said second interval and said second interval.

5. The apparatus in accordance with claim 2 wherein said start TMU comprises:

a first plurality of logic means (20), each being clocked by a separate one of said timing signals, each being enabled when an enable signal input thereto is asserted, each receiving said start signal, and each producing an output data bit indicating a current state of said start signal when clocked while enabled;

first means (36/38) for asserting the enable signal input to each of said first plurality of logic means following occurrence of said edge of said arming signal and for deasserting the enable signal input to each of said first plurality of logic means following occurrence of said edge of said start signal; and a first counter (62) for counting said first number of edges of said one of said timing signals occurring between said edge of said arming signal edge and said edge of said start signal, wherein said stop TMU comprises:

a second plurality of logic means, each being clocked by a separate one of said timing signals, each being enabled when an enable signal input thereto is asserted, each receiving said stop signal, and each producing an output data bit indicating a current state of said stop signal when clocked while enabled;

second means for asserting the enable signal input to each of said second plurality of logic means following occurrence of said edge of said arming signal and for deasserting the enable signal input to each of said second plurality of logic means following occurrence of said edge of said stop signal; and a second counter for counting said second number of edges of said one of said timing signals occurring between said edge of said arming signal edge and said edge of said stop signal.

6. The apparatus in accordance with claim 5 wherein each logic means of said plurality of first logic means and said plurality of second logic means is a flip-flop.

7. The apparatus in accordance with claim 1 wherein said timing signal generator means comprises:

a delay line comprising a plurality of gates connected in series, said clock signal being applied to a first gate of said delay line, each successive gate delaying an output of its preceding gate to produce one of said timing signals with a delay controlled by a magnitude of a control signal applied in common to all of said gates, a last gate of said delay line generating a periodic reference signal; and a phase lock controller for receiving said clock signal and said periodic reference signal for adjusting switching speeds of said gates by adjusting said magnitude of said control signal such that said periodic reference signal is phase locked to said clock signal.

8. The apparatus in accordance with claim 1 wherein said timing signal generator means comprises:

a ring oscillator for producing said timing signals, wherein a phase of each timing signal relative to a phase of said clock signal is controlled by a magnitude of a control signal provided as input to said ring oscillator; and a phase lock controller, receiving said clock signal and one of said timing signals generated by said ring oscillator, for adjusting said magnitude of said control signal such that said one of said timing signal is phase locked to said clock signal.

9. The apparatus in accordance with claim 2 wherein said timing signals consist of a first group of timing signals (T0–T15) and a second group of timing signals (T16–T31), wherein said start TMU comprises:

a plurality of first logic means (20(1)–20(15)), each first logic means being clocked by a separate one of said first group of timing signals, being enabled when a first enable signal (EN_A) input thereto is asserted, receiving said start signal, and producing an output data bit indicating a current state of said start signal when clocked while enabled;

a plurality of second logic means (20(16)–20(31)), each second logic means being clocked by a separate one of said second group of timing signals, each being enabled when a second enable signal (EN_B) input thereto is asserted, receiving said start signal, and producing an output data bit indicating a current state of said start signal when clocked while enabled;

first enabling means (36,40) for asserting said first enable signal input to said first bank of logic means in response to an edge of one of said second group of timing signals occurring after said edge of said arming signal and for deasserting said first enable signal in response to an edge of one of said second group of timing signals occurring after said edge of said start signal; and second enabling means (38,42) for asserting said second enable signal input to said second bank of logic means in response to an edge of one of said first group of timing signals occurring after said edge of said arming signal and for deasserting said second enable signal input to said second bank of logic mean in response to an edge of one of said first group of timing signals occurring after said edge of said start signal.

10. An apparatus for measuring a time interval between an edge of a start signal and an edge of a stop signal in response to an edge of an arming signal supplied as input thereto, the apparatus comprising:

means (17) for generating a clock signal that is periodic;

timing signal generator means (18) responsive to said clock signal for generating a plurality of first timing signals and a plurality of second timing signals, said first and second timing signals being periodic and frequency locked to said clock, each of said first and second timing signal having a unique phase;

a first bank of logic means (30(0)–30(15)), each being clocked by a separate one of said first timing signals, each being enabled when a first enable signal (EN_A) input thereto is asserted, each receiving said start signal and producing a first bit indicating a current state of said start signal when clocked while enabled, first bits produced by said first bank of logic means forming a first data field;

a second bank of logic means (30(16)–30(31), each being clocked by a separate one of said second timing signals, each being enabled when a second enable signal (EN_B) input thereto is asserted, each receiving said start signal and producing a second bit indicating a current state of said start signal when clocked while enabled, second bits produced by said second bank of logic means forming a second data field;

a third bank of logic means, each being clocked by a separate one of said first timing signals, each being enabled when a third enable signal input thereto is asserted, each receiving said stop signal and producing a third bit indicating a current state of said stop signal when clocked while enabled, third bits produced by said third bank of logic means forming a third data field;

a fourth bank of logic means, each being clocked by a separate one of said second timing signals, each being enabled when a fourth enable signal input thereto is asserted, each receiving said stop signal and producing a fourth bit indicating a current state of said stop signal when clocked while enabled, first enabling means, receiving said arming signal, one of said second timing signals, and first bits produced by said first bank of logic means, for asserting said first enable signal in response to an edge of said one of said second timing signals received after said edge of said arming signal and for deasserting said first enable signal in response to an edge of said one of said second timing signals following a change in state of any one of said first bits;

second enabling means, receiving said arming signal, one of said first timing signals, and second bits produced by said second bank of logic means, for asserting said second enable signal in response to an edge of said one of said first timing signals received after said edge of said arming signal and for deasserting said second enable signal in response to an edge of said one of said first timing signals following a change in state of any one of said second bits;

third enabling means, receiving said arming signal, said one of said second timing signals, third bits produced by said third bank of logic means, and said first enable signal, for asserting said third enable signal in response to an edge of said one of said second timing signals received after said edge of said arming signal and for deasserting said third enable signal after said first enable signal is deasserted in response to an edge of said one of said second timing signals following a change in state of any one of said third bits;

fourth enabling means, receiving said arming signal, one of said first timing signals, second bits produced by said second bank of logic means and said second enable signal, for asserting said fourth enable signal in response to an edge of said one of said first timing signals received after said edge of said arming signal and for deasserting said fourth enable signal after said second enable signal is deasserted in response to an edge of said one of said first timing signals following a change in state of any one of said fourth bits.

11. The apparatus in accordance with claim 10 further comprising:

means for counting a first number of edges of one of said first and second timing signals occurring between said arming signal edge and de-assertion of said second enabling signal and for producing output first count data indicating said first number; and means for counting a second number of edges of said one of said first and second timing signals occurring between said arming signal edge and de-assertion of said fourth enabling signal and for producing output second count data indicating said second number.

12. The apparatus in accordance with claim 11 further comprising means for processing the first, second, third and fourth data bits produced by said first, second, third and fourth banks of logic means and said first and second count data to produce output interval data representing an interval between said edge of said start signal and said edge of said stop signal.

13. The apparatus in accordance with claim 10 wherein said timing signal generator means comprises:

a plurality of first gates connected in series to form a first delay line, said clock signal being applied as input to said first delay line, each first gate generating a separate one of said first timing signals;

a plurality of second gates connected in series to form a second delay line, a first timing signal generated by a last first gate of said first delay line being applied as input to a first second gate of said second delay, each second gate generating a separate one of said first timing signals; and a phase lock controller receiving said clock signal and an output signal generated by said second delay line for adjusting switching speeds of gates such that said output signal is phase locked to said clock signal.

14. The apparatus in accordance with claim 10 wherein said timing signal generator means comprises:

a ring oscillator for producing said first and second timing signals, wherein a phase of each first and second timing signals relative to a phase of said clock signal is controlled by a magnitude of a control signal provided as input to said ring oscillator; and a phase lock controller, receiving said clock signal and one of said first and second timing signals generated by said ring oscillator, for adjusting said magnitude of said control signal such that said one of said first and second timing signals is phase locked to said clock signal.

* * * * *